(12) United States Patent
Hart et al.

(10) Patent No.: US 9,147,546 B2
(45) Date of Patent: Sep. 29, 2015

(54) SELF-CALIBRATING CURRENT SWITCH WITH DISPLAY

(75) Inventors: Joel Edward Hart, Tualatin, OR (US); Mark D. Rowan, Wilsonville, OR (US); Troy Earl Wecker, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 159 days.

(21) Appl. No.: 13/483,556

(22) Filed: May 30, 2012

(65) Prior Publication Data

US 2013/0135111 A1 May 30, 2013

Related U.S. Application Data

(60) Provisional application No. 61/565,078, filed on Nov. 30, 2011.

(51) Int. Cl.
| H01H 71/12 | (2006.01) |
| H01H 71/74 | (2006.01) |
| G01R 19/00 | (2006.01) |
| H02H 3/00 | (2006.01) |
| H01H 71/00 | (2006.01) |

(52) U.S. Cl.
CPC .............. *H01H 71/125* (2013.01); *H01H 71/74* (2013.01); *G01R 19/0092* (2013.01); *H01H 2071/006* (2013.01); *H02H 3/006* (2013.01)

(58) Field of Classification Search
CPC ................................ G01R 31/086; H02H 3/08
USPC .......................................................... 702/120
See application file for complete search history.

(56) References Cited

U.S. PATENT DOCUMENTS

| 4,351,013 | A | * | 9/1982 | Matsko et al. ................... 361/96 |
| 4,616,216 | A | * | 10/1986 | Meirow et al. ................. 340/644 |
| 2008/0008313 | A1 | * | 1/2008 | Fyke ........................ 379/433.01 |
| 2008/0048879 | A1 | * | 2/2008 | Lipman ........................ 340/688 |
| 2009/0115620 | A1 | * | 5/2009 | Hunter et al. ................. 340/664 |
| 2011/0301464 | A1 | * | 12/2011 | Yoo et al. ...................... 600/443 |
| 2012/0300348 | A1 | * | 11/2012 | Franks et al. ................... 361/42 |

* cited by examiner

*Primary Examiner* — Steven Lim
*Assistant Examiner* — Hongmin Fan
(74) *Attorney, Agent, or Firm* — Chernoff Vilhauer McClung & Stenzel, LLP

(57) ABSTRACT

A current switch self-calibrates when a reset control is actuated and displays an expected current in the monitored conductor, one or more trip points of the current switch and the last known current in the monitored conductor.

12 Claims, 6 Drawing Sheets

SELF-CALIBRATING CURRENT SWITCH WITH DISPLAY

CROSS-REFERENCE TO RELATED APPLICATIONS

This application claims the benefit of U.S. Provisional App. No. 61/565,078, filed Nov. 30, 2011.

BACKGROUND OF THE INVENTION

The present invention relates to a current switch for monitoring electric current in a conductor and, more particularly, to a self-calibrating current switch having a display.

Industrial and commercial environments utilize large numbers of electrically powered devices, such as heaters, valves, fans, pumps and compressors. The proper operation of these devices can be important to the protection of valuable property and successful completion of processes that may involve costly or hazardous equipment, operations or materials. The operation of these devices is commonly monitored by current switches which include a current transducer which outputs a signal that is representative of the current flowing in a conductor supplying power to the monitored device(s) and a sensing switch that changes state when the signal from the current transducer indicates that the current in the monitored conductor has crossed a trip point, sometimes referred to as a set point, for the switch. The current switch is typically connected to a controller which, when the state of the sensing switch changes, may display a warning or an advisory signal for a human operator and/or selectively enable or disable power to the device and/or other devices of a system that might be affected by a malfunction of a device connected to the conductor monitored by the current switch.

Holce et al., U.S. Pat. No. 5,808,846, incorporated herein by reference, disclose a protective device comprising a current sensor for monitoring current in a cable supplying power to a load and an input circuit for signaling a controller when the current reaches a trip point. The current sensor is a sensing transformer comprising a wire wound core that encircles a power cable. A changing current in the power cable, the primary winding of the sensing transformer, produces a changing electro-magnetic field around the cable which, in turn, induces a magnetic flux in the core of the transformer. The magnetic flux in the core induces a voltage in the wire winding, the transformer's secondary winding, which is representative of the current flowing in the power cable. The wire winding is electrically connected to the input circuit that outputs a signal to a controller when the voltage signal in the secondary winding of the transformer indicates an improper current in the power cable. The protective device also includes a status output which can energize or deenergize the monitored device or another device in response to a signal from the controller.

Current switches are available with either a fixed trip point or an adjustable trip point. A current switch with a fixed trip point provides cost effective "go/no go" monitoring but is usually unsuitable for monitoring circuits for events which can cause the electrical load, for example, a motor, to continue to operate but at either reduced or increased current draw. For example, belt loss or shearing of a coupling connecting a motor and a mechanical load can cause the mechanical load to malfunction while the electrical load, the motor, continues to operate with a reduced current. On the other hand, a mechanical failure, such as a bearing failure, will often cause an increase in the current draw of a motor for some period before the motor stops operating. The trip point of some current switches can be adjusted to enable detection of low or high currents indicative of these types of failures. Typically, the system is started and allowed to achieve steady state operation. Then the installer adjusts a potentiometer in the current switch to vary the trip point until the state of the sensing switch changes indicating that the trip point is equal to the normal operating current in the monitored conductor. Continued adjustment of the potentiometer adjusts the trip point to a current that is either somewhat greater than or somewhat less than the normal operating current. Thereafter, the sensing switch will change state when the current in the monitored conductor crosses the trip point. While current switches with adjustable trip points provide greater utility, adjusting the trip points of the current switches is time consuming and installation can be costly, particularly when large numbers of current switches are involved. In addition, while the trip point is known to be a value which is either greater or less than the conductor current when the system is operating normally, additional instrumentation and monitoring is required to determine the magnitudes of the conductor current and the trip point(s) of the current switch if the trip point is a function of the conductor current. Moreover, the magnitude of a current causing the current switch to trip is not readily knowable which can complicate troubleshooting particularly if the current switch has both an upper and a lower trip point.

What is desired, therefore, is a current switch that self-calibrates to a current in the monitored conductor and enables a user to visually determine the current in the conductor and the trip point of the current switch.

DETAILED DESCRIPTION OF PREFERRED EMBODIMENTS

Figure 1:
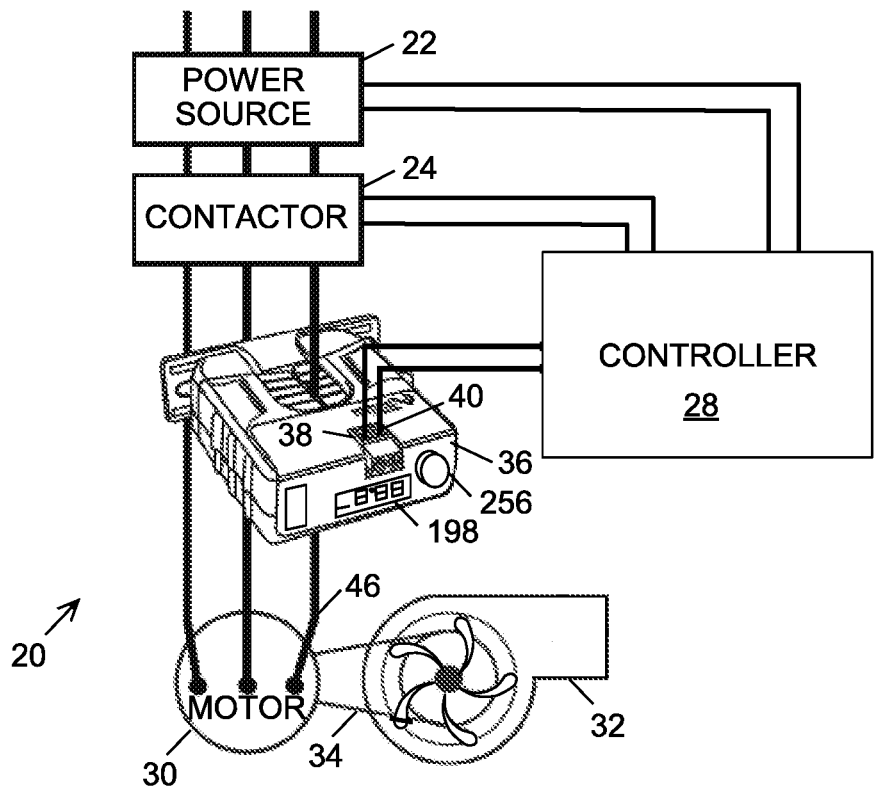
FIG. 1 is a schematic representation of an exemplary electrical circuit that includes a current switch.

Referring in detail to the drawings where similar parts are identified by like reference numerals, and, more particularly to FIG. 1, an exemplary electrically powered system 20 includes an electrical load, comprising a motor 30, that is connected by a drive belt 34 or other mechanical connection to drive a mechanical load; such as, by way of examples only, a compressor, a pump or, as illustrated, a fan 32. Other electrically powered systems monitored by current switches, such as a heater system, may not include a mechanical load. In the exemplary system 20, a contactor 24, controlled by a system controller 28, selectively connects the motor 30 to a source 22 of single-phase or multiphase AC electrical power, usually a utility's power distribution grid. A current switch 36 monitors the current flowing in one of the power cables 46 connecting the contactor and the motor. When the motor is running and current is flowing in the power cable, a current transducer in the current switch outputs a signal reflecting the magnitude of the current in the monitored conductor. If the magnitude of the current is within prescribed limits, the current switch causes an electrical connection between terminals 38, 40, which are communicatively connected to the system controller 28, to assume either an open or a closed conductive state. A malfunction in the system is typically indicated by a significant increase or decrease in the current draw of the motor. For example, an electrical short or the seizure of bearings in either the motor or the mechanical load will cause a significant increase in the current draw and an abnormally high current is an indication of a failure or a pending failure in the system. Likewise, a failure of the belt or other coupling to the mechanical load will substantially decrease the current flowing to the motor. If the magnitude of the current flowing in the power cable 46 crosses the current switch's trip or set point, the current switch changes the connection state of the switch terminals 38, 40 signaling the system controller 28 of a malfunction in the monitored circuit. The system controller may respond to the change in connection state of the switch terminals 38, 40 by, for examples, initiating an alarm, disconnecting the motor 30 from the power source and/or energizing or de-energizing other elements of some larger system.

Figure 2:
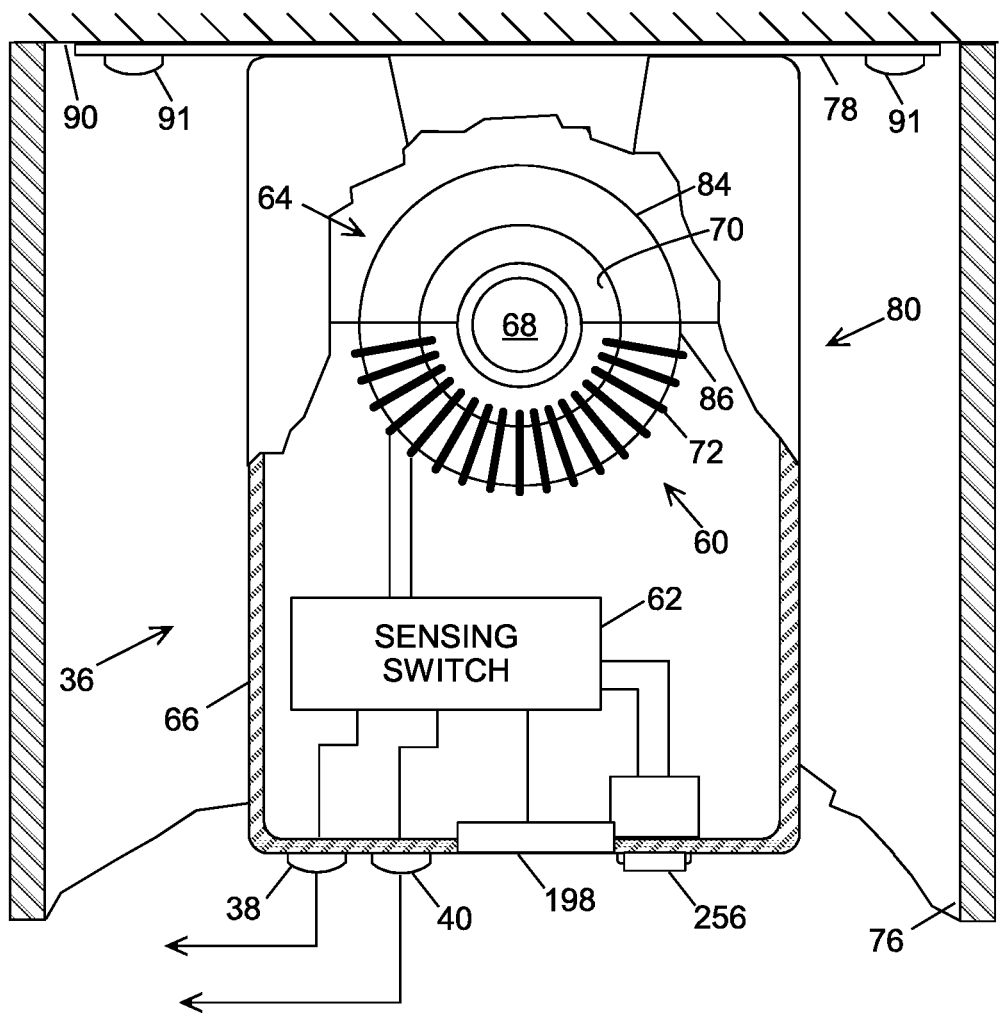
FIG. 2 is a block representation of a current switch.
Figure 3:
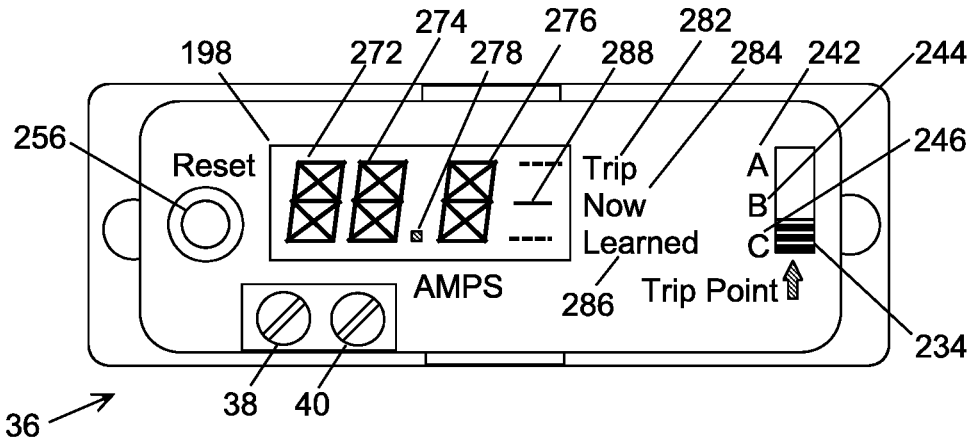
FIG. 3 is a plan view of an end of an exemplary current switch.
Figure 4:
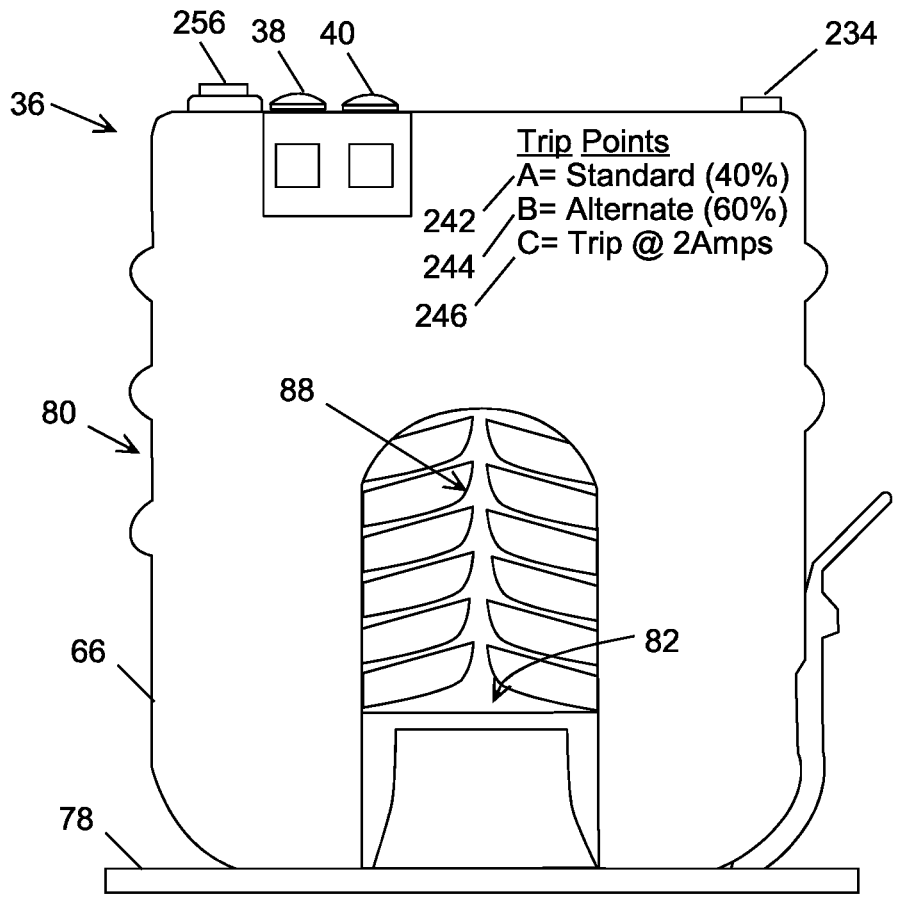
FIG. 4 is an elevation view of the exemplary current switch of FIG. 3.

Referring to FIGS. 2, 3 and 4, the self-calibrating current switch 36 comprises, generally, a current transducer 60 which outputs a signal representative of the current flowing in a monitored conductor and a sensing switch 62 responsive to the transducer signal to determine whether the transducer signal indicates an unexpected current in the monitored conductor. Although it could comprise other types of current transducers, the current transducer 60 of the exemplary current switch 36 is preferably a current transformer comprising, preferably, a wire-wrapped magnetically permeable toroidal core 64, normally made of iron that is typically contained within a protective housing 66. The conductor 68 in which the current is to be monitored, for example, power cable 46, is routed through the central aperture 70 in the toroidal core. Changes in the current flowing in the conductor 68 produce a variable electromagnetic field around the conductor which, in turn, induces a magnetic flux in the magnetically permeable core 64 of the transformer. The magnetic flux in the core, in turn, induces a voltage in the wire 72 that is wound around the cross-section of a portion of the toroidal core (e.g. split core). The monitored conductor 68, a power cable or a parallel shunt current divider (not shown), routed through the aperture in the core, is the primary winding and the wire 72 wound on the core is the secondary winding of the transformer. The voltage induced in the secondary winding is representative of the current in the monitored conductor.

A current transformer with a core of magnetically permeable material, such as iron, generates a voltage signal that reasonably accurately represents the current in the power cable over a certain normal load range. However, iron and other magnetically permeable materials have hysteresis and other nonlinear responses to changing magnetic fields that result in a nonlinear relationship between current in the power cable and the voltage signal produced in the secondary winding of the transformer. The nonlinearity of such responses is especially significant with large variations in load current and frequency. To provide a more linear measurement of power, "air core" transformers have been designed using wire wrapped on a core made of material having a low magnetic permeability, such as one of plastic or nylon. Without a magnetically permeable core, however, the transformer winding generates relatively lower voltage levels in response to a particular power cable current. An exemplary air core transformer has the following construction: core of nylon, outside diameter of 1.375 inches, inside diameter of 1.125 inches, strip width of 0.500 inches, and having a secondary winding comprising 4,000 turns of #35 AWG wire with a heavy polyurethane coating and wound as a secondary winding. Examples of circuitry suitable for use with an "air core" transformer are disclosed in U.S. Pat. No. 5,502,374 assigned to Veris Industries, Inc.

Figure 5:
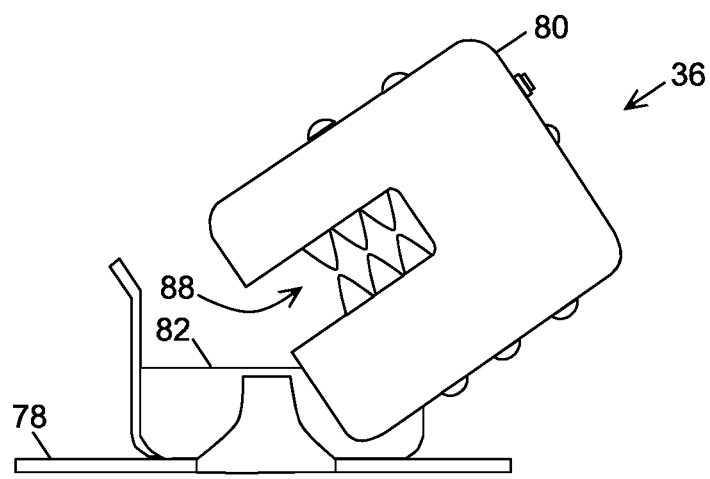
FIG. 5 is an elevation view of the exemplary current switch of FIG. 3 showing the split core portions hinged open during installation.

While many current transformers have a solid toroidal core, the current transformer 64 of the exemplary current switch 36 preferably comprises a split core to simplify installation on existing wiring. A current switch is commonly installed in another enclosure 76, often a motor starter enclosure, in which there is limited space. Further, the conductor to be monitored is often already connected to electrical apparatus located inside or outside of the enclosure. Referring to FIG. 5, the housing 66 of the exemplary current switch 36 is detachable from its mounting bracket 78 and comprises hinged portions 80, 82 each containing a respective portion 84, 86 of the current transformer's core 64. With the portions of the current switch 80, 82 hinged apart, as illustrated in FIG. 5, a conductor can be located in the window 88 in the body of the current switch without disconnecting the conductor. Closing the hinged portions of the current switch assembles the toroidal core with the conductor in the core's aperture 70. The body of the exemplary current switch can then be snapped into the bracket 78 which is secured to a mounting surface 90 by screws 91. The current switch 36 is inductively powered by the current in the monitored conductor and requires no external power connections or batteries and conductively connecting the output terminals 38, 40 to the system controller 28 or other receiver of the current switch's output signal completes the physical installation of the current switch.

Figure 6A:
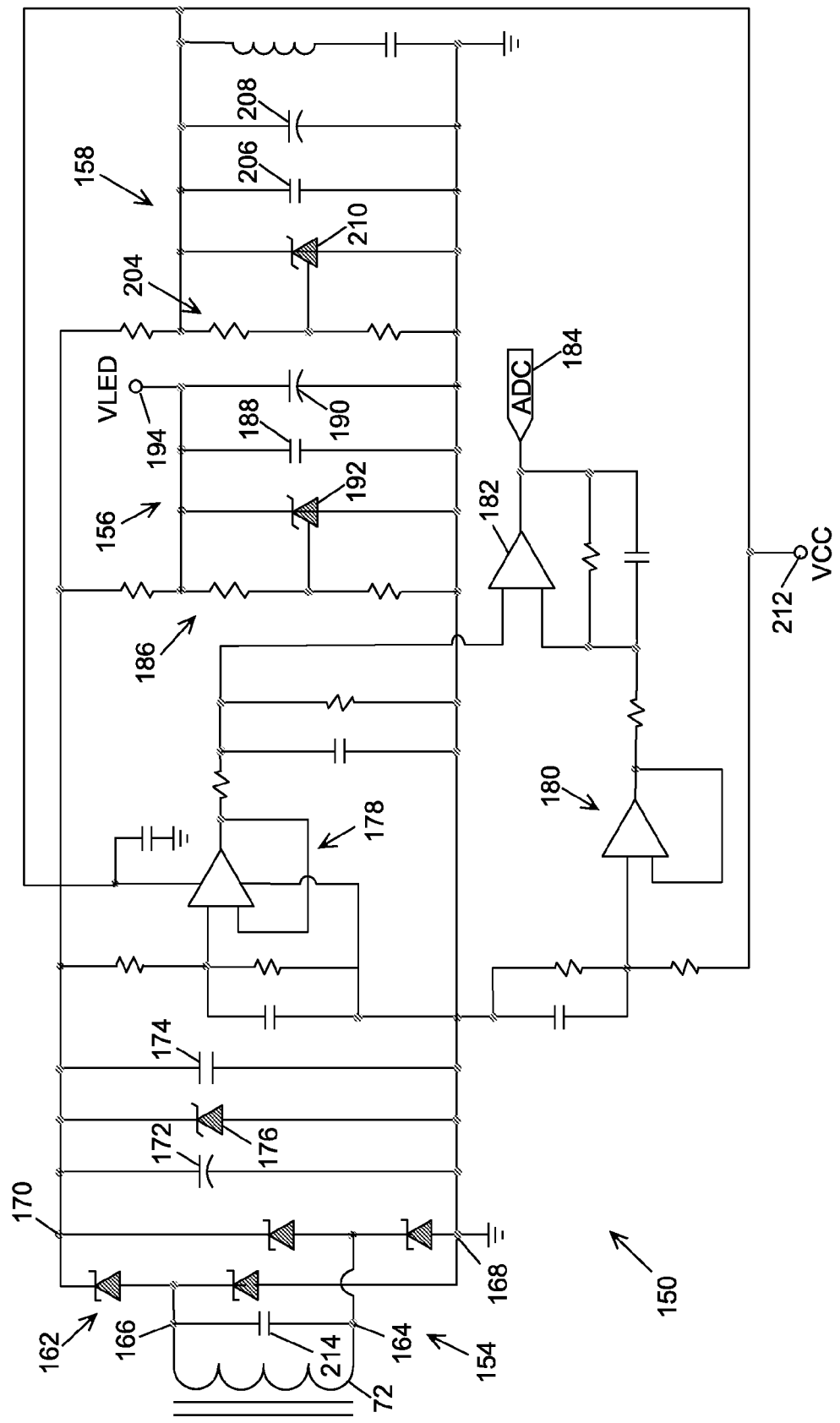
FIG. 6A is a first portion of a circuit diagram for the exemplary current switch of FIG. 2.
Figure 6B:
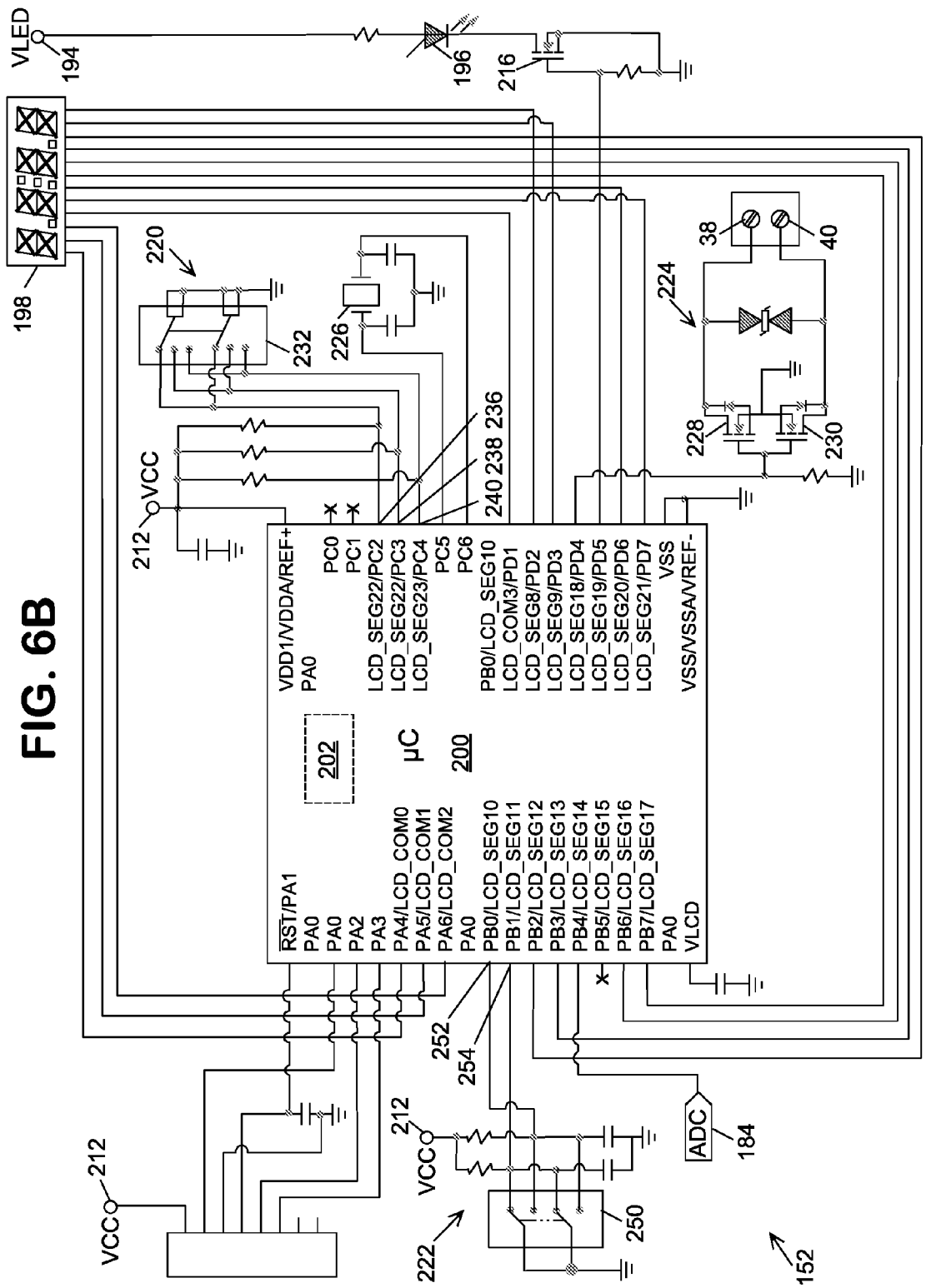
FIG. 6B is a second portion of a circuit diagram for the exemplary current switch of FIG. 2.

Referring also to FIGS. 6A and 6B, the exemplary current switch 36 comprises, generally, a signal generating portion 150, including a current transducer 154; a first power source 156; a second power source 158 and a sensing switch comprising a data processing and output portion 152. The current transducer is preferably a current transformer generating an analog signal representing the current in the monitored conductor. A rectifier 162 connected to the terminals 164, 166 of the secondary winding 72 of the current transformer produces a DC output signal at the rectifier's terminals 168, 170 that is substantially proportional to the magnitude of the current in the monitored conductor 68. Filter capacitors 172, 174, connected between the output terminals of the rectifier, attenuate ripples in the rectifier's output signal induced by fluctuations of the current in the monitored conductor. A diode clamp 176, in parallel with the filter capacitors, limits the magnitude of the output voltage signal from the rectifier. Voltage followers 178, 180 connected to the rectifier's output terminals isolate the input of an inverting amplifier 182 from the rectifier output reducing signal attenuation at the inverting amplifier and increasing the range of conductor currents that can be monitored. The output of the inverting amplifier 182 is an analog signal representative of the current in the monitored conductor and is input to an analog-to-digital converter (ADC) input 184 of a microcontroller 200 of the data processing and output portion 152 of the current switch.

The first power source 156 comprises a voltage divider 186, filter capacitors 188 and 190 and a clamping diode 192. The first power source 156 supplies an output voltage (VLED) 194 to power a light emitting diode (LED) 196 that serves as a backlight for a liquid crystal display (LCD) 198 which is located in the end of the enclosure 66 for the current switch. The second power source 158 comprising, similarly, a voltage divider 204, filter capacitors 206 and 208 and a voltage clamping diode 210 is a source of a common collector voltage (VCC) 212 providing power for the inverting amplifier, voltage followers and the microcontroller 200 and establishing a reference voltage for a plurality of the microcontroller's inputs.

The current switch 36 is inductively powered by the current in the monitored conductor and requires no other power source. A resonating capacitor 214, connected to the output terminals 164, 166 of the current transformer's secondary winding, is selected so that the resonant frequency of the circuit comprising the resonating capacitor and the secondary winding approximates the frequency of the alternating current in the monitored conductor. At frequencies near the resonant frequency, the resonating capacitor increases the amplitude of the voltage at the output of the current transformer. While the resonance produces little effect at higher conductor current levels, it distorts the waveform sufficiently to increase the root mean square (RMS) value of the voltage signal when the current in the monitored conductor is low enabling the current switch to sense conductor currents as low as 1.0 amp (A). To reduce the power drawn from the conductor when the conductor current is low, the microcontroller 200 controls the gate signal to the transistor driver 216 for the LED 196 backlight, to extinguish the backlight. In addition, the microcontroller 200 includes program instructions that slows the sampling rate of the ADC input 184 when the conductor current is low to further reduce the power required to operate the current switch.

In addition to the microcontroller 200 which includes a non-volatile memory 202 for storing data and program instructions, the data processing and output portion 152 of the current switch comprises generally a clock crystal 226 providing timing signals to the microcontroller, the display (LCD) 198, a trip point selector 220, a reset control 222 and output terminal control circuitry 224. The terminals 38, 40 of the current switch are communicatively connected to a terminal of the microcontroller by transistors 228 and 230 which also selectively and conductively connect the terminals. Either a conductively open or a conductively closed condition between the terminals can signal a first state of the current switch and the other of the conductively open or closed state of the terminals can indicate the second state of the current switch when, for example, the switch trips. When a signal from the microcontroller 200 is applied to the gates of the transistors, the terminals 38, 40 are conductively connected. When the gate signal is removed by the microcontroller when, for example, the current in the monitored conductor crosses a trip point for the current switch, the connection between the terminals 38, 40 is opened. Alternatively, the output signal from the microcontroller could be used to control a transmitter of 4-20 mA current loop.

The data processing and output portion 152 of the current switch 36 also includes a trip point control 220. The trip point control 220 preferably comprises a plural position, trip point switch 232 with an actuator 234 located in the end of the current switch's housing 66 for easy access by the user. In the exemplary current switch 36, the user selectable position of the trip point switch selectively establishes a voltage to one of three digital input/output pins 236, 238, 240 of the microcontroller 200. The microcontroller's processing of program instructions stored in the memory 202 causes the microcontroller to determine which digital input/output pin 236, 238, 240 has been biased and thereby which of the trip point(s) stored in the memory is associated with the selected position of the trip point switch 232. For example, the trip point control 220 of the exemplary current switch 36 enables user selection of five trip points through actuation of the three position trip point switch 222: position "A" 242 selects trip points at ±40% of the expected conductor current; position "B" 244 selects trip points at ±60% of conductor current; or trip point "C" 246 selects a trip point at currents less than 2 A with no maximum current. However, trip points with different relationships to the conductor current or different constant trip point current magnitudes could be provided for a current switch.

Figure 7:
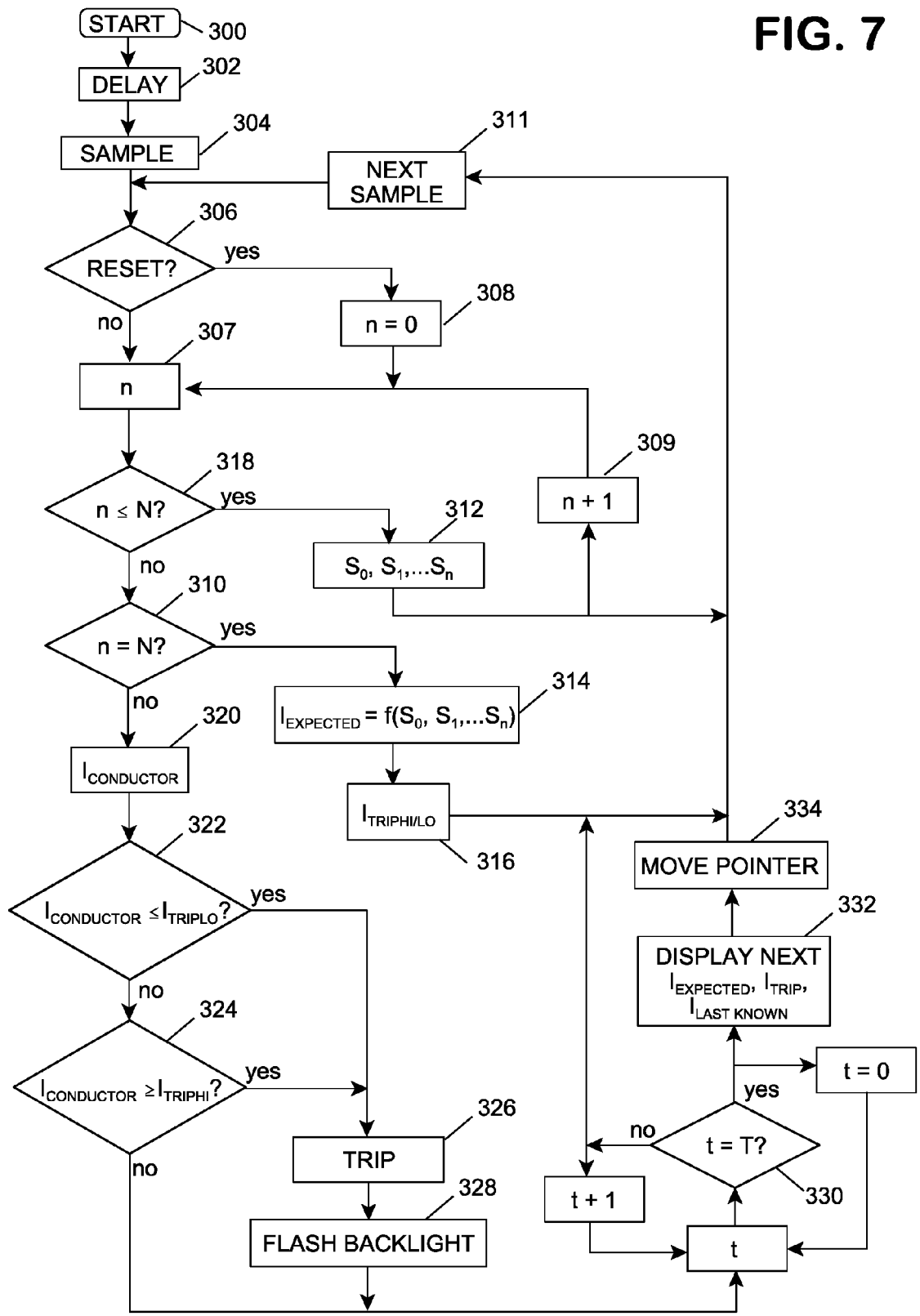
FIG. 7 is a flow diagram for the exemplary current switch of FIG. 2.

Referring also FIG. 7, when power is applied to the monitored conductor 68, the current transformer 64 inductively couples to the monitored conductor and an analog signal representative of the current in the monitored conductor is induced in the secondary winding 72 of the current transformer which produces an output at the inverting amplifier 182. In addition, the LED voltage (VLED) 194 is output by the first power source 156 and the common collector voltage (VCC) 212 is output by the second power source 158 to power the microcontroller 200. Following a delay 302 to enable dissipation of inrush currents that accompany start up of an electrical device, the microcontroller samples the analog output of the inverting amplifier 304.

The microcontroller checks the state of the reset control 306 to determine if the state of the reset control 222 has changed since the previous sample was obtained. The reset control 222, preferably, comprises a plural position, latching reset switch 250 connected to two input pins 252, 254 of the microcontroller 200. The reset switch 250 includes a latching mechanism, for examples an internal latch, a latching pushbutton, a rocker or a lever actuator, that maintains the selected position of the switch until the user actuates the switch a second time. In the exemplary current switch 36, the reset switch actuator comprises a latching pushbutton 256 accessible at one end of the case 66 of the current switch. To determine if the reset switch was actuated 306 after the last sample was obtained, the microcontroller checks the voltages at the input pins 252, 254 connected to the reset switch 250 and compares the identity of the pin that was biased when the last sample was obtained which is stored in the memory 202 with the identity of the pin to which the voltage is current being applied. When the reset switch is actuated, it latches in the new position and the microcontroller will recognize from the voltages at its input pins 252, 254 that the state of the reset control has changed even if the current switch was not powered when the reset switch was actuated.

If the state of the reset control 222 has changed since the last sample was obtained 306, the microcontroller 200 will undertake recalibration including learning a current that is to be expected in the monitored conductor. The microcontroller initiates 308 a counter 307 and begins to accumulate samples of the inverting amplifier's 182 output 312. The microcontroller continues to accumulate samples 312 and increment the counter 309 until the counter expires 318. For example, the exemplary current switch 36 preferably accumulates current samples for 30 seconds although other time intervals might be used in learning the expected conductor current. When the desired number of samples has been accumulated 310, the microcontroller determines the expected or learned current for the monitored conductor 314, preferably by averaging the conductor currents represented by the plurality of accumulated amplifier output samples 312, although other relationships between the sample values and the expected current might be utilized. The microcontroller checks the trip point selector inputs 236, 238, 240 to determine which trip point has been selected by the user. If the selected trip point has a relationship to the conductor current, for example, position "A" or position "B" for the exemplary current switch, the microcontroller calculates the trip point(s). The trip point(s), either calculated or constant is stored in the microcontroller's memory 316. When the trip point(s) has been determined, the microcontroller determines the conductor current 320 from subsequent samples of the output of the inverting amplifier 318 and compares the conductor current to the stored lower trip point current ($I_{TRIP\ LO}$) 322 and upper trip point current ($I_{TRIP\ HI}$) 324 to determine if the current in the monitored conductor has crossed a trip point. The cost of installing the current switch is substantially reduced because the installer does not need to manually calibrate the current switch following its physical installation. When the installer has completed the physical installation of the current switch, actuation of the reset control will cause the current switch to calibrate itself when power is next applied to the monitored conductor 300.

If the conductor current has crossed a trip point, the current switch trips 326. The microcontroller changes the voltage on the output pin connected to the terminal driver transistors 228, 230 to open or close, as appropriate for the current switch, the conductive connection between the terminals. In addition, the microcontroller will alternately apply and remove a voltage at the pin connected to the gate of the LED driver 216 to flash 328 the LCD's backlight 196 to indicate that a trip point has been crossed.

The LCD display 198 of the exemplary current switch 36 comprises a seven segment display which can display four numerals and a plurality of position designators such as decimal points. Program instructions stored in the memory 202 of the microcontroller 200, preferably, cause the LCD to display up to three numbers and a decimal point to indicate the magnitude of a current to a tenth of an amp. The program instructions for the exemplary current switch 36 also cause the microcontroller to store the latest conductor current and to sequentially display 332, for intervals established by a counter 330, the expected or "LEARNED" current in the conductor 286, the trip point(s) 282 and the most recent or last known conductor ("NOW") current 284. In addition, the program instructions cause the microcontroller 200 to activate the respective ones of the horizontal segments 288 of the fourth position of the LCD as pointers to indicate to a user which of the currents (expected, trip or last known) is presently being displayed 334. By inspecting the LCD, a user can determine whether the conductor current has changed substantially from the expected current learned by the current switch during calibration and, if so, how likely it is to cause the current switch to trip, providing the user with an early indication of the nature and magnitude of potential problems in the monitored circuit. In addition, if the current switch should trip, the value of the last known conductor current which caused the current switch to trip and which is stored in the memory can assist troubleshooting in the monitored circuit.

The self-calibrating current switch substantially reduces the time and cost of current switch installation by eliminating a lengthy manual calibration process and facilitates troubleshooting by periodically displaying the trip point(s) and the normal and abnormal, if any, current in the monitored conductor.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A current switch for monitoring a current in a conductor, said current switch comprising:
    (a) a current transducer producing a transducer output indicative of a magnitude of a current in said conductor;
    (b) a reset control operable to select either one of a first reset control state and a second reset control state;
    (c) a memory storing a program instruction and at least one datum indicating a last selected state of said reset control; and
    (d) a processing unit communicatively connected to said reset control and operating according to a program instruction stored in said memory to determine an expected current in said conductor if a reset control state presently selected at said reset control differs from said last selected reset control state.

2. The current switch of claim 1 wherein said reset control retains a selected reset control state until it is manually operated to select the other of said first reset control state and said second reset control state.

3. The current switch of claim 1 wherein said processing unit operating according to a program instruction stored in said memory determines said expected current in said conductor from a relationship of a plurality of temporally spaced samples of said current transducer output.

4. The current switch of claim 3 wherein said processing unit determines said expected current from an average of said plurality of temporally spaced samples of said current transducer output.

5. The current switch of claim 1 further comprising a trip point selector communicatively connected to said processing unit and manually operable to select one of plural trip points.

6. The current switch of claim 5 wherein at least one of said plural trip points has a relationship to said expected current which is determined by said processing unit according to a program instruction stored in said memory from a plurality of temporally spaced samples of said transducer output.

7. The current switch of claim 1 further comprising a program instruction stored in said memory and executable by said processing unit to reduce a rate of sampling said transducer output when said processing unit determines that said current in said conductor has reached a limit.

8. A method of monitoring a current in a conductor, said method comprising the steps of:
    (a) determining a state of a reset control;
    (b) if said state of said reset control differs from a stored state for said reset control stored in a memory;
        (i) storing a sample current representing a momentary magnitude of said current in said conductor;
        (ii) repeating step (i) to accumulate a predetermined number of said sample currents;
        (iii) determining an expected current in said conductor from said predetermined number of sample currents; and
        (iv) determining and storing a trip point current; and
    (c) if said state of said reset control does not differ from said stored state of said reset control and a sample current in said conductor does not cross a trip point current, sampling said current in said conductor again; and (d) if said state of said reset control does not differ from said stored state of said reset control and said current in said conductor does cross a trip point current, initiating an alarm.

9. The method of monitoring a current in a conductor of claim 8 wherein the step of determining an expected current in said conductor from said predetermined number of sample currents comprises the step of averaging said sample currents.

10. The method of monitoring a current in a conductor of claim 8 wherein the step of determining and storing a trip point current comprises the steps of:

(a) if a relationship between said trip point current and said current in said conductor has been selected for said trip point current, determining said trip point current according to said relationship and storing same; and (b) if a constant has been selected for said trip point current, storing said constant as said trip point current.

11. The method of monitoring a current in a conductor of claim 8 further comprising the steps of:

(a) displaying said expected current;

(b) following said displaying of said expected current, displaying one of said trip point current or said current in said conductor; and (c) following step (b), displaying the other of said trip point current and said current in said conductor.

12. The method of monitoring a current in a conductor of claim 8 further comprising the step of displaying an indicator of which of said expected current, said trip point current and said current in said conductor is presently being displayed.

\* \* \* \* \*